US010332935B2

(12) United States Patent
Ishikawa et al.

(10) Patent No.: US 10,332,935 B2
(45) Date of Patent: Jun. 25, 2019

(54) STORAGE APPARATUS (71) Applicant: TOSHIBA MEMORY CORPORATION, Minato-ku, Tokyo (JP)

(72) Inventors: Takayuki Ishikawa, Yokkaichi Mie (JP); Mutsumi Okajima, Yokkaichi Mie (JP); Takayuki Tsukamoto, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/927,326

(22) Filed: Mar. 21, 2018

(65) Prior Publication Data

US 2019/0088720 A1    Mar. 21, 2019

(30) Foreign Application Priority Data

Sep. 20, 2017    (JP) ................ 2017-179789

(51) Int. Cl.
*H01L 47/00* (2006.01)
*H01L 27/24* (2006.01)
*H01L 45/00* (2006.01)

(52) U.S. Cl.
CPC .......... *H01L 27/2463* (2013.01); *H01L 45/06* (2013.01); *H01L 45/146* (2013.01)

(58) Field of Classification Search
CPC ....... H01L 45/04; H01L 45/06; H01L 45/065; H01L 45/124; G11C 13/0002; G11C 13/0011; G11C 13/0028; G11C 2013/0042
See application file for complete search history.

(56) References Cited

U.S. PATENT DOCUMENTS

| 9,059,395 | B2 * | 6/2015 | Ju ........................ H01L 45/08 |
| 9,711,721 | B2 | 7/2017 | Takagi et al. |
| 2007/0025475 | A1 | 2/2007 | Okunev |
| 2013/0200331 | A1 | 8/2013 | Morikawa et al. |
| 2015/0249092 | A1 | 9/2015 | Sakui et al. |
| 2017/0125482 | A1 | 5/2017 | Izumida et al. |
| 2017/0141161 | A1 | 5/2017 | Sakotsubo |

FOREIGN PATENT DOCUMENTS

JP        5919010 B2    5/2016

* cited by examiner

*Primary Examiner* — Hsien Ming Lee
(74) *Attorney, Agent, or Firm* — Foley & Lardner LLP (57) ABSTRACT A storage apparatus according to embodiments includes: a first interlayer insulating film extending in a first direction; a second interlayer insulating film extending in the first direction; a first conductive layer extending in the first direction and provided between the first interlayer insulating film and the second interlayer insulating film; a second conductive layer extending in a second direction intersecting the first direction; a resistance change layer including a first portion provided between the first interlayer insulating film and the second interlayer insulating film and including a second portion provided between the second conductive layer and the first interlayer insulating film, between the second conductive layer and the first conductive layer, and between the second conductive layer and the second interlayer insulating film; and a sidewall insulating film provided between the first portion and the first interlayer insulating film and between the first portion and the second interlayer insulating film.

6 Claims, 12 Drawing Sheets

STORAGE APPARATUS

CROSS-REFERENCE TO RELATED APPLICATION

This application is based upon and claims the benefit of priority from Japanese Patent Application No. 2017-179789, filed on Sep. 20, 2017, the entire contents of which are incorporated herein by reference.

FIELD

Embodiments described herein relate generally to a storage apparatus.

BACKGROUND

As a large-capacity nonvolatile memory, two-terminal resistance change memories, namely, resistive random access memories have been actively developed in place of a conventional floating gate type NAND flash memory. This type of memory is capable of low-voltage and low-current operation, high-speed switching, miniaturization and high integration of memory cells.

A large-capacity memory array includes a large number of metal wires referred to as bit lines and word lines arranged to intersect each other so as to form a memory cell at an intersection of the bit line and the word line. Writing into a single memory cell is performed by applying voltages to bit lines BL and word lines WL connected to the cell.

DETAILED DESCRIPTION

Hereinafter, embodiments will be described with reference to the drawings. In the drawings, the same or similar reference numerals are attached to the same or similar portions.

First Embodiment

The storage apparatus according to the present embodiment includes: a first interlayer insulating film extending in a first direction; a second interlayer insulating film extending in the first direction; a first conductive layer extending in the first direction and provided between the first interlayer insulating film and the second interlayer insulating film; a second conductive layer extending in a second direction intersecting the first direction; a resistance change layer including a first portion provided between the first interlayer insulating film and the second interlayer insulating film and including a second portion provided between the second conductive layer and the first interlayer insulating film, between the second conductive layer and the first conductive layer, and between the second conductive layer and the second interlayer insulating film; and a sidewall insulating film provided between the first portion and the first interlayer insulating film and between the first portion and the second interlayer insulating film.

Figure 1:
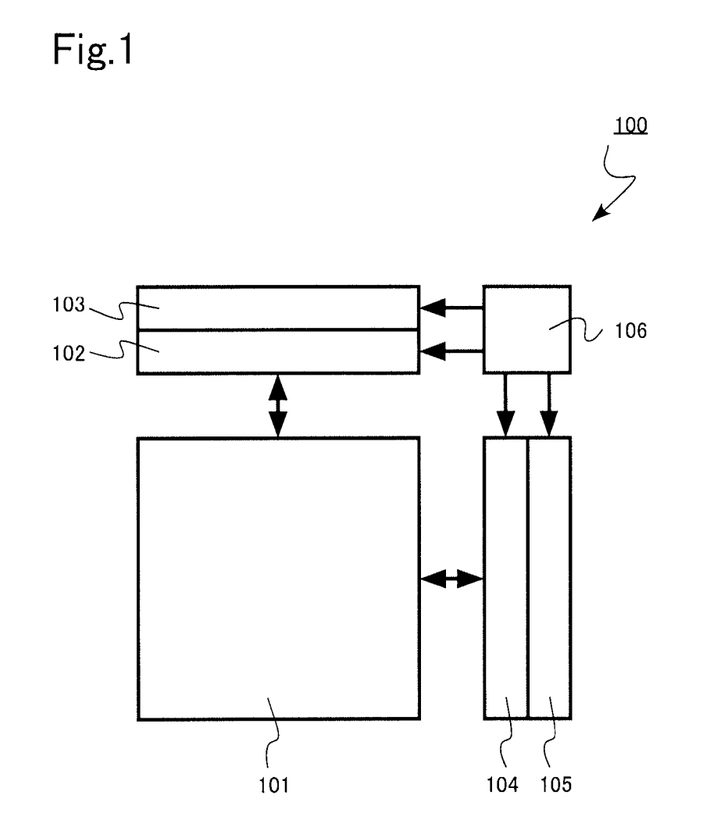
FIG. 1 is a block diagram of a storage apparatus according to a first embodiment.
Figure 2:
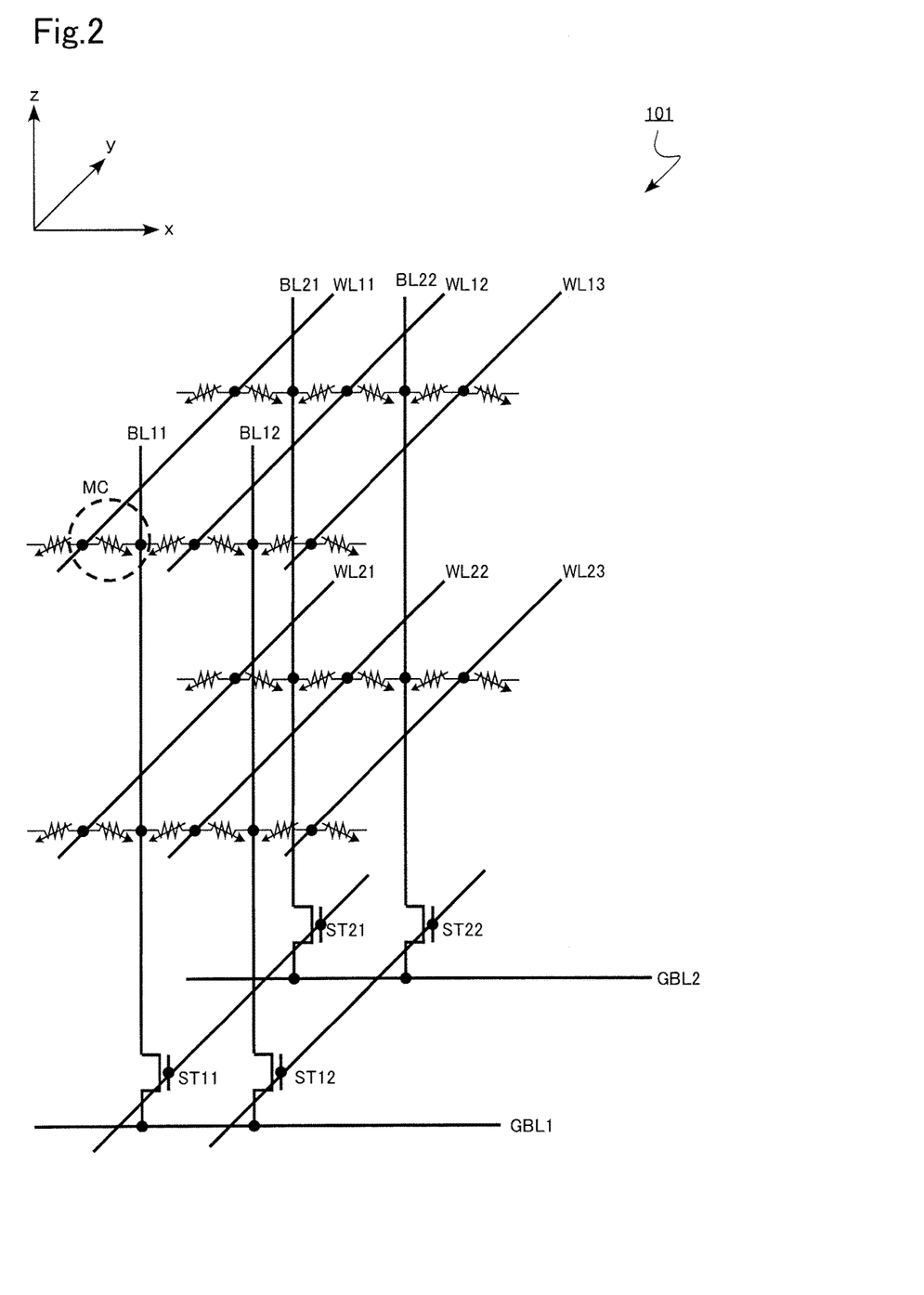
FIG. 2 is an equivalent circuit diagram of a memory cell array of the storage apparatus according to the first embodiment.

FIG. 1 is a block diagram of a storage apparatus according to the present embodiment. FIG. 2 is an equivalent circuit diagram of a memory cell array 101. FIG. 2 schematically illustrates a wiring structure in the memory cell array 101.

A storage apparatus 100 according to the present embodiment is a phase change memory. The phase change memory stores data using a resistance change accompanying a change in a crystal structure of the resistance change layer.

Furthermore, a memory cell array 101 according to the present embodiment has a three-dimensional structure in which memory cells are three-dimensionally disposed. With the three-dimensional structure, the degree of integration of the storage apparatus 100 is enhanced.

As illustrated in FIG. 1, the storage apparatus 100 includes the memory cell array 101, a word line driver circuit 102, a row decoder circuit 103, a sense amplifier circuit 104, a column decoder circuit 105, and a control circuit 106.

As illustrated in FIG. 2, a plurality of memory cells MC is three-dimensionally disposed in the memory cell array 101. In FIG. 2, a region surrounded by a broken line corresponds to one memory cell MC.

The memory cell array 101 includes a plurality of word lines WL (WL 11, WL 12, WL 13, WL 21, WL 22, and WL 23) and a plurality of bit lines BL (BL 11, BL 12, BL 21, and BL 22). The word line WL extends in the y-direction. The bit line BL extends in the z-direction. The word line WL intersects the bit line BL perpendicularly. The memory cell MC is disposed at an intersection of the word line WL and bit line BL.

Hereinafter, the word line WL 11, the word line WL 21, the word line WL 31, or the like, will be collectively referred to simply as the word line WL in some cases. Similarly, the bit lines BL 11, BL 21, BL 12, or the like, will be collectively referred to simply as the bit line BL in some cases.

The word line WL is a conductive layer. The word line WL is a metal layer, for example. The word line WL includes tungsten, titanium nitride, or copper, for example. The word line WL may be formed of another metal, a metal semiconductor compound, or a conductive material such as a semiconductor.

The bit line BL is a conductive layer. The bit line BL is a metal layer, for example. The bit line BL includes tungsten, titanium nitride, or copper, for example. The bit line BL may be formed of another metal, a metal semiconductor compound, or a conductive material such as a semiconductor.

The pitch of the word line WL in the x-direction is 50 nm or more and 200 nm or less, for example. The thickness of the word line WL in the z-direction is 30 nm or less, for example. The pitch of the bit line BL in the x-direction is 50 nm or more and 200 nm or less, for example.

The pitch of the word line WL in the x-direction, the thickness of the word line WL in the x-direction, and the pitch of the bit line BL in the x-direction can be measured by observation with a transmission electron microscope.

The y-direction perpendicularly intersecting the x-direction is an example of the first direction and the z-direction perpendicularly intersecting the x-direction and y-direction is an example of the second direction.

The plurality of word lines WL is electrically connected to the row decoder circuit 103. The plurality of bit lines BL is connected to the sense amplifier circuit 104. Selection transistors ST (ST 11, ST 21, ST 12, and ST 22) and global bit lines GBL (GEL 1 and GBL 2) are provided between the plurality of bit lines BL and the sense amplifier circuit 104.

The row decoder circuit 103 has a function of selecting the word line WL in accordance with an input row address signal. The word line driver circuit 102 has a function of applying a predetermined voltage to the word line WL selected by the row decoder circuit 103.

The column decoder circuit 105 has a function of selecting the bit line BL in accordance with an input column address signal. The sense amplifier circuit 104 has a function of applying a predetermined voltage to the bit line EL selected by the column decoder circuit 105. The sense amplifier circuit 104 has a function of detecting and amplifying the current flowing between the selected word line WL and the selected bit line BL.

The control circuit 106 has a function of controlling the word line driver circuit 102, the row decoder circuit 103, the sense amplifier circuit 104, the column decoder circuit 105, and other circuits (not illustrated).

The circuits such as the word line driver circuit 102, the row decoder circuit 103, the sense amplifier circuit 104, the column decoder circuit 105, the control circuit 106 are electronic circuits. For example, these circuits include transistors using semiconductor layers and wiring layers (not illustrated).

Figure 3:
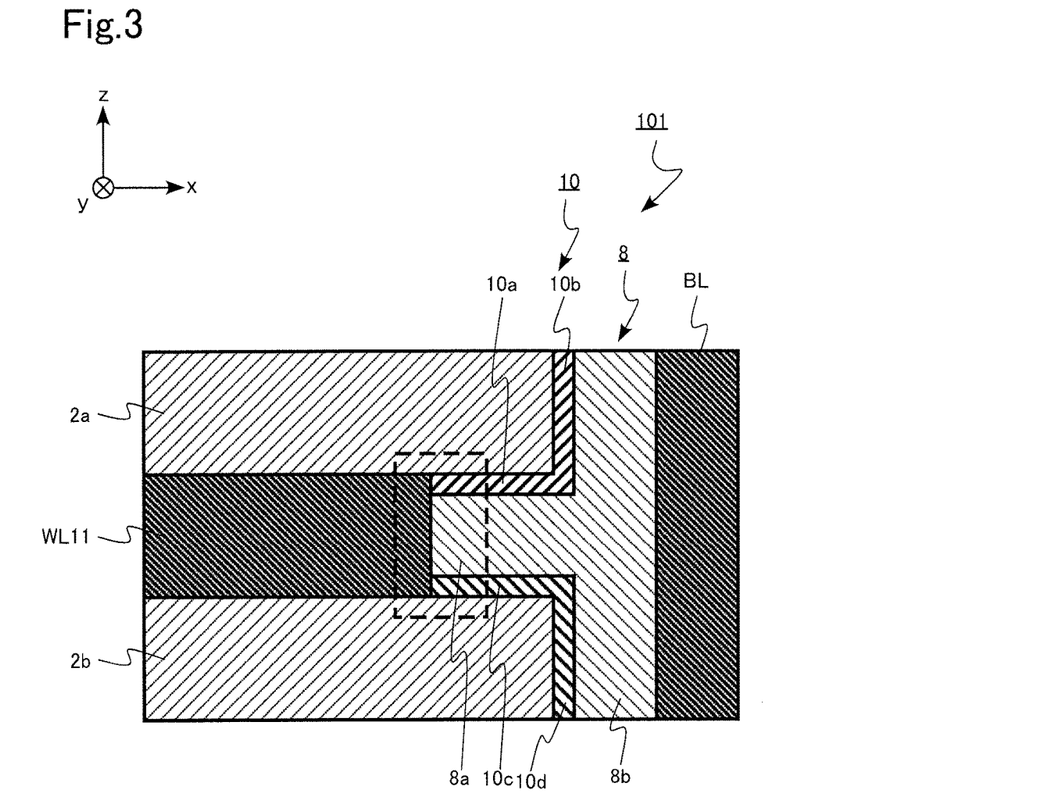
FIG. 3 is a schematic cross-sectional view of main portions of the memory cell array of the storage apparatus according to the first embodiment.

FIG. 3 is a schematic cross-sectional view of main portions of the memory cell array 101 of the storage apparatus 100 according to the present embodiment. FIG. 3 is a x-z cross-sectional view of the memory cell array 101. In FIG. 3, a region surrounded by a broken line is one memory cell MC.

A first interlayer insulating film 2a extends in the y-direction.

A second interlayer insulating film 2b extends in the y-direction.

The first interlayer insulating film 2a and the second interlayer insulating film 2b contain, for example, an oxide, an oxynitride, or a nitride.

The word line (first conductive layer) WL extends in the y-direction and is provided between the first interlayer insulating film 2a and the second interlayer insulating film 2b.

The bit line (second conductive layer) BL extends in the z-direction intersecting the y-direction.

A resistance change layer 8 includes a first portion 8a and a second portion 8b.

The first portion 8a is provided between the first interlayer insulating film 2a and the second interlayer insulating film 2b. In other words, the length of the word line WL in the x-direction is shorter than the length of the first interlayer insulating film 2a in the x-direction and the length of the second interlayer insulating film 2b in the x-direction. The first portion 8a is provided on the side of the word line WL in the x-direction.

The second portion 8b extends in the z-direction and extends between the bit line BL and the first interlayer insulating film 2a, between the bit line BL and the word line WL (between the first portion 8a and the word line WL), and between the bit line BL and the second interlayer insulating film 2b.

The resistance change layer 8 contains chalcogenide, for example. The resistance change layer 8 is chalcogenide containing germanium (Ge), antimony (Sb), and tellurium (Te), for example. The resistance change layer 8 is a $Ge_2Sb_2Te_5$ alloy, for example.

The sidewall insulating film 10 includes: a sidewall insulating film 10a provided between the first portion 8a and the first interlayer insulating film 2a; a sidewall insulating film 10c provided between the first portion 8a and the second interlayer insulating film 2b; a sidewall insulating film 10b provided between the second portion 8b and the first interlayer insulating film 2a; and a sidewall insulating film 10d provided between the second portion 8b and the second interlayer insulating film 2b.

The sidewall insulating film 10 contains silicon oxide, silicon nitride, carbon-containing silicon oxide, silicon oxynitride, aluminum oxide, or hafnium oxide.

FIGS. 4 to 7 are schematic cross-sectional views illustrating the storage apparatus 100 during manufacture in the manufacturing method of the storage apparatus according to the present embodiment.

Figure 4:
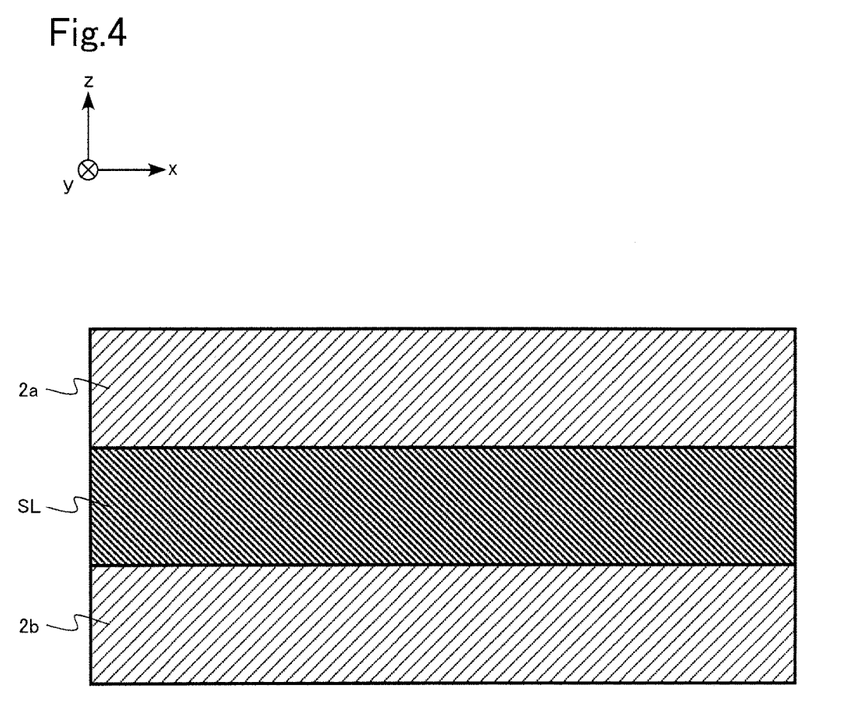
FIG. 4 is a schematic cross-sectional view illustrating a storage apparatus during manufacture with a manufacturing method for the storage apparatus according to the first embodiment.

First, the second interlayer insulating film 2b extending in the y-direction and containing an oxide, an oxynitride, or a nitride, for example, is formed. Next, a sacrificial layer SL extending in the y-direction and containing an oxide, an oxynitride, or a nitride, for example, is formed. Next, the first interlayer insulating film 2a extending in the y-direction and containing an oxide, an oxynitride, or a nitride, for example, is formed (FIG. 4). This process is repeated to form a plurality of sacrificial layers SL and a plurality of interlayer insulating films.

Figure 5:
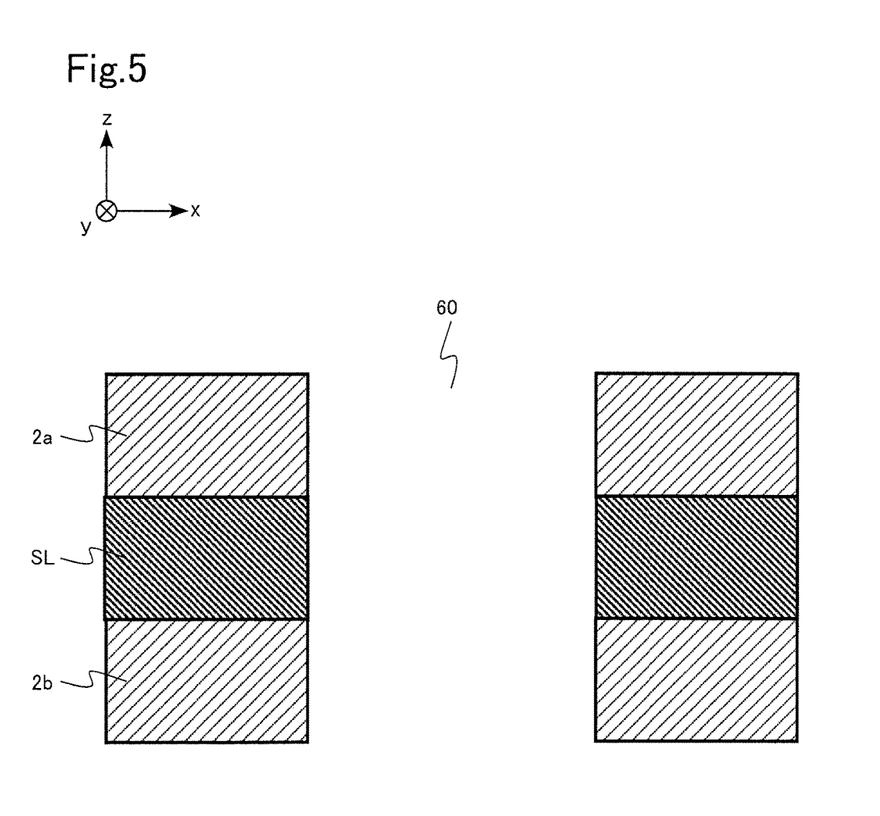
FIG. 5 is a schematic cross-sectional view illustrating a storage apparatus during manufacture with the method for the storage apparatus according to the first embodiment.

Next, a vacancy 60 extending in the z-direction is formed in the plurality of sacrificial layers SL and the plurality of interlayer insulating films (FIG. 5).

Figure 6:
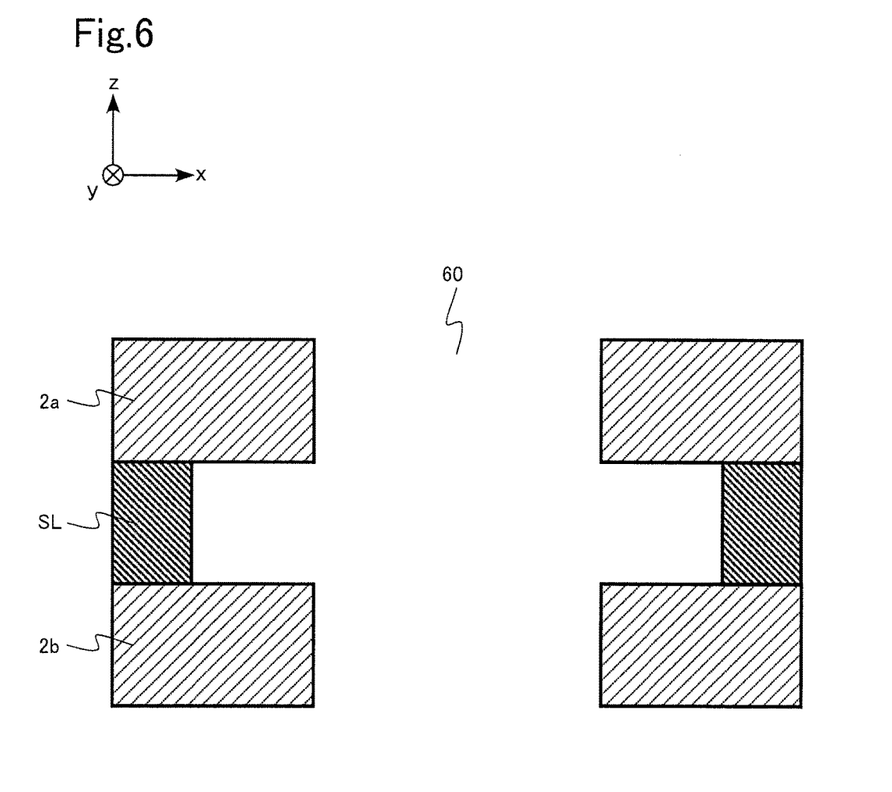
FIG. 6 is a schematic cross-sectional view illustrating a storage apparatus during manufacture with the method for the storage apparatus according to the first embodiment.

Next, a portion of the sacrificial layer SL surrounding the vacancy 60 is removed by wet etching, for example (FIG. 6).

Next, the sidewall insulating film 10a extending in the y-direction and the sidewall insulating film 10b extending in the z-direction are formed on the surface of the first interlayer insulating film 2a surrounding the vacancy 60. The sidewall insulating film 10c extending in the y-direction and the sidewall insulating film 10d extending in the z-direction are formed on the surface of the second interlayer insulating film 2b.

Next to form is the resistance change layer 8 including the first portion 8a provided between the sidewall insulating film 10a and the sidewall insulating film 10c and including the second portion 8b connected to the first portion 8a and extending in the z-direction.

Next, the bit line BL is formed so as to be adjacent to the resistance change layer 8.

Next, the plurality of sacrificial layers SL is removed by wet etching, for example.

Figure 7:
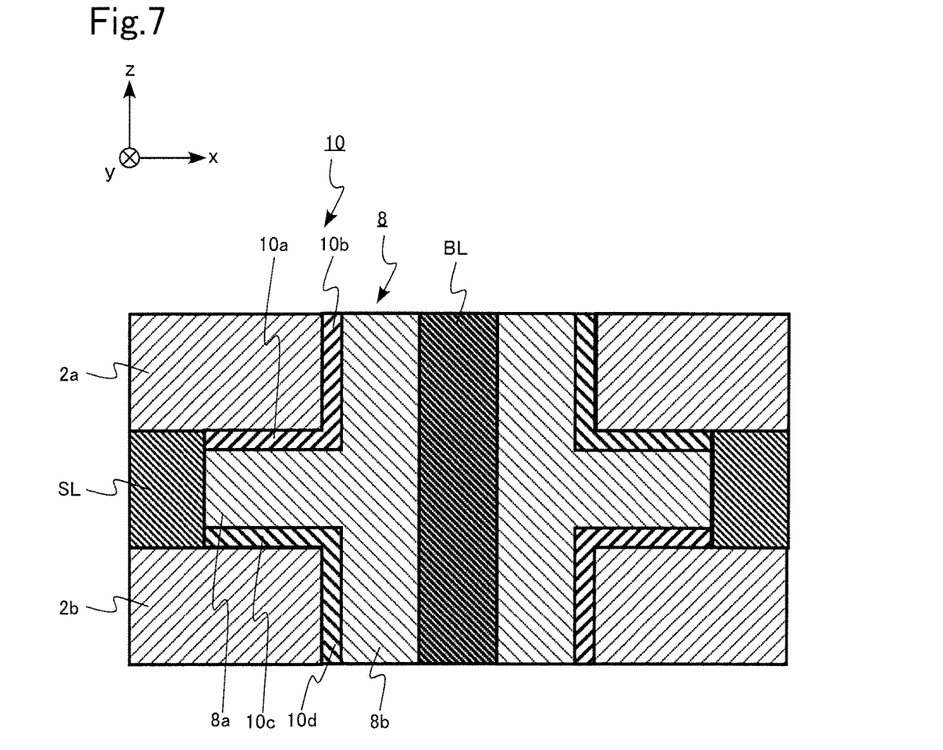
FIG. 7 is a schematic cross-sectional view illustrating a storage apparatus during manufacture with the method for the storage apparatus according to the first embodiment.

Next, the word line WL is formed at a portion from which the plurality of sacrificial layers SL has been removed to obtain the storage apparatus 100 according to the present embodiment (FIG. 7).

Next, operational effects of the storage apparatus 100 according to the present embodiment will be described.

Figure 8A:
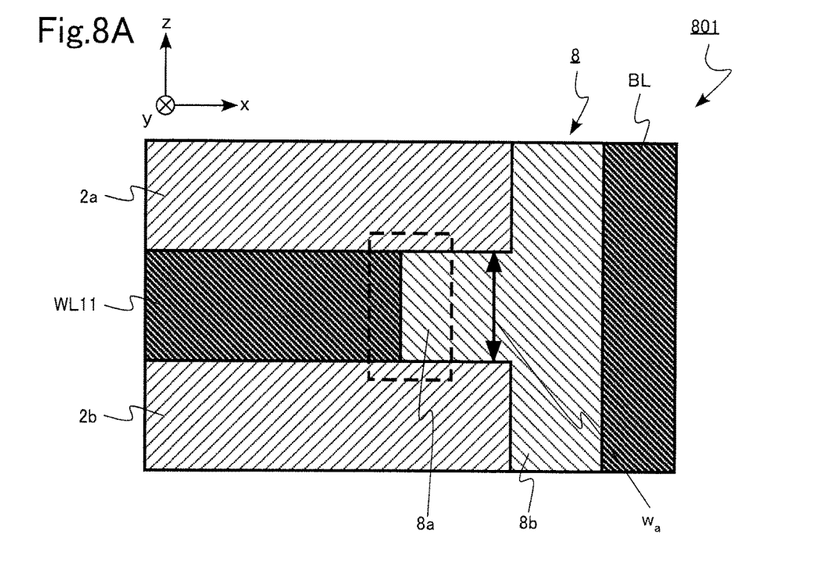
FIGS. 8A and 8B are diagrams illustrating operational effects of the memory array of the storage apparatus according to the first embodiment.
Figure 8B:
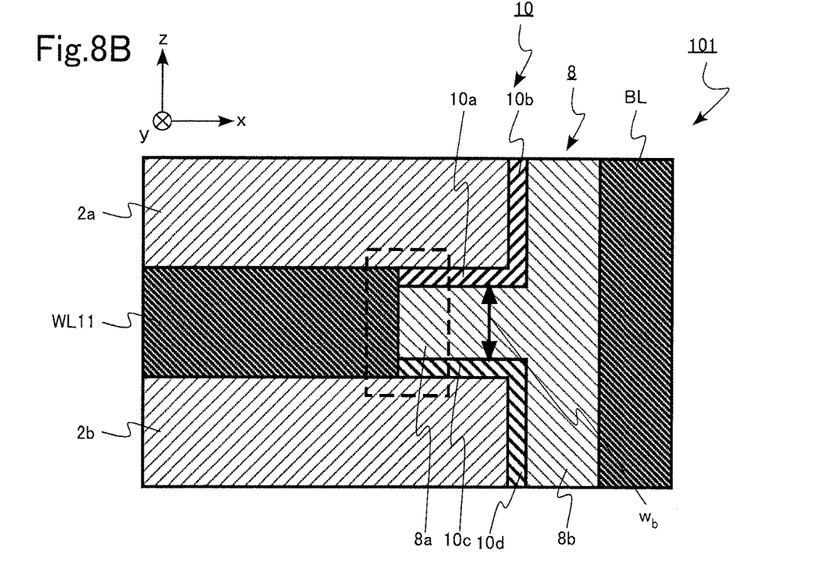

FIGS. 8A and 8B are diagrams illustrating operational effects of the storage apparatus 100 according to the present embodiment.

FIG. 8A is a schematic cross-sectional view of main portions of a memory cell array 801 which is a comparative embodiment. FIG. 8B is a schematic cross-sectional view of main portions of the memory cell array 101 according to the present embodiment.

In a case where the current flowing through the memory cell MC increases to an excessive level at the time of reading or writing, the current may exceed an allowable current level in a specification of the selection transistor ST. The thickness of the first portion 8a of the memory cell array 801 as the comparative embodiment is $w_a$.

The storage apparatus 100 according to the present embodiment includes the sidewall insulating film 10a and the sidewall insulating film 10c provided respectively between the first portion 8a and the first interlayer insulating film 2a and between the first portion 8a and the second interlayer insulating film 2b. With this configuration, the thickness of the first portion 8a of the memory cell array 101 is $w_b$, smaller than $w_a$. This makes it possible to reduce the current flowing through the memory cell MC, leading to implementation of the storage apparatus that facilitates writing.

With the storage apparatus 100 according to the present embodiment, it is possible to provide a storage apparatus that facilitates writing.

Second Embodiment

A storage apparatus according to the present embodiment differs from the storage apparatus of the first embodiment in that it includes an oxide region provided between the first conductive layer and the first portion and includes a semiconductor region provided between the first conductive layer and the oxide region. The description overlapping with the first embodiment will be omitted.

Figure 9:
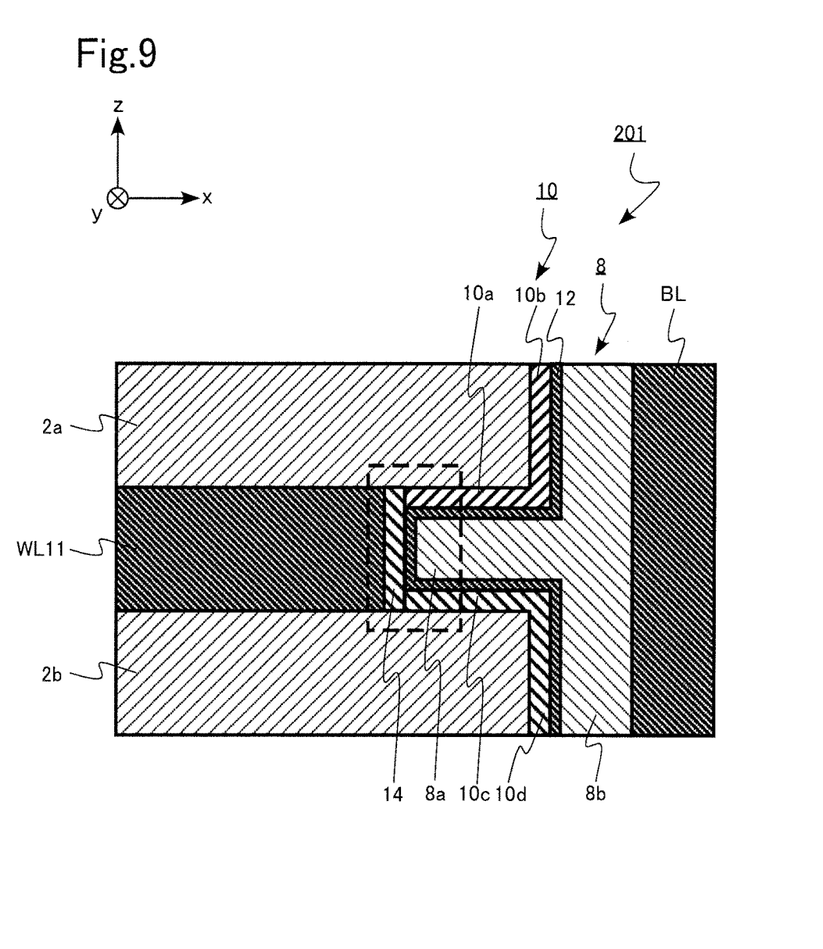
FIG. 9 is a schematic cross-sectional view of main portions of a memory cell array of a storage apparatus according to a second embodiment.

FIG. 9 is a schematic cross-sectional view of main portions of a memory cell array 201 of the storage apparatus according to the present embodiment.

The storage apparatus according to the present embodiment is a resistance change memory devices, namely, a resistive random access memory (ReRAM). In the ReRAM, for example, modulation of vacancy concentration by bias application is utilized to a band structure of titanium oxide and amorphous silicon, thereby changing the electric resistance.

The resistance change layer 8 includes titanium oxide, tungsten oxide, or niobium oxide, for example. The resistance change layer 8 is a transition metal compound.

The oxide region 12 is provided between the sidewall insulating film 10b and the second portion 8b, between the sidewall insulating film 10a and the first portion 8a, between the word line WL and the first portion 8a, between the sidewall insulating film 10c and the first portion 8a, and between the sidewall insulating film 10d and the second portion 8b. The oxide region 12 contains aluminum oxide, hafnium oxide, and zirconium oxide, for example.

The semiconductor region 14 is provided between the word line WL and the oxide region 12. The semiconductor region 14 contains silicon or germanium, for example. The semiconductor region 14 is silicon, silicon germanium, or germanium, for example. The semiconductor region 14 is amorphous silicon, for example.

With the storage apparatus 100 according to the present embodiment, it is possible to provide a storage apparatus that facilitates writing.

Third Embodiment

A storage apparatus according to the present embodiment includes: a plurality of interlayer insulating films extending in a first direction; a plurality of first conductive layers extending in the first direction and provided between each of the interlayer insulating films; a second conductive layer extending in a second direction intersecting the first direction; a resistance change layer provided between the second conductive layer and the plurality of interlayer insulating films and between the second conductive layer and the plurality of first conductive layers, the resistance change layer including a plurality of first portions provided between the plurality of interlayer insulating films, and a second portion provided between the second conductive layers and the plurality of first portions, and between the second conductive layer and the plurality of interlayer insulating films; and a sidewall insulating film provided between the first portions and the interlayer insulating films, wherein a first distance between one first conductive layer and the second conductive layer is shorter than a second distance between another first conductive layer and the second conductive layer, a thickness of the sidewall insulating film provided between the interlayer insulating film adjacent to the one first conductive layer and the first portion adjacent to the one first conductive layer is smaller than the thickness of the sidewall insulating film provided between the interlayer insulating film adjacent to the other first conductive layer and the first portion adjacent to the other first conductive layer. The description overlapping with the first embodiment and the second embodiment will be omitted.

Figure 10:
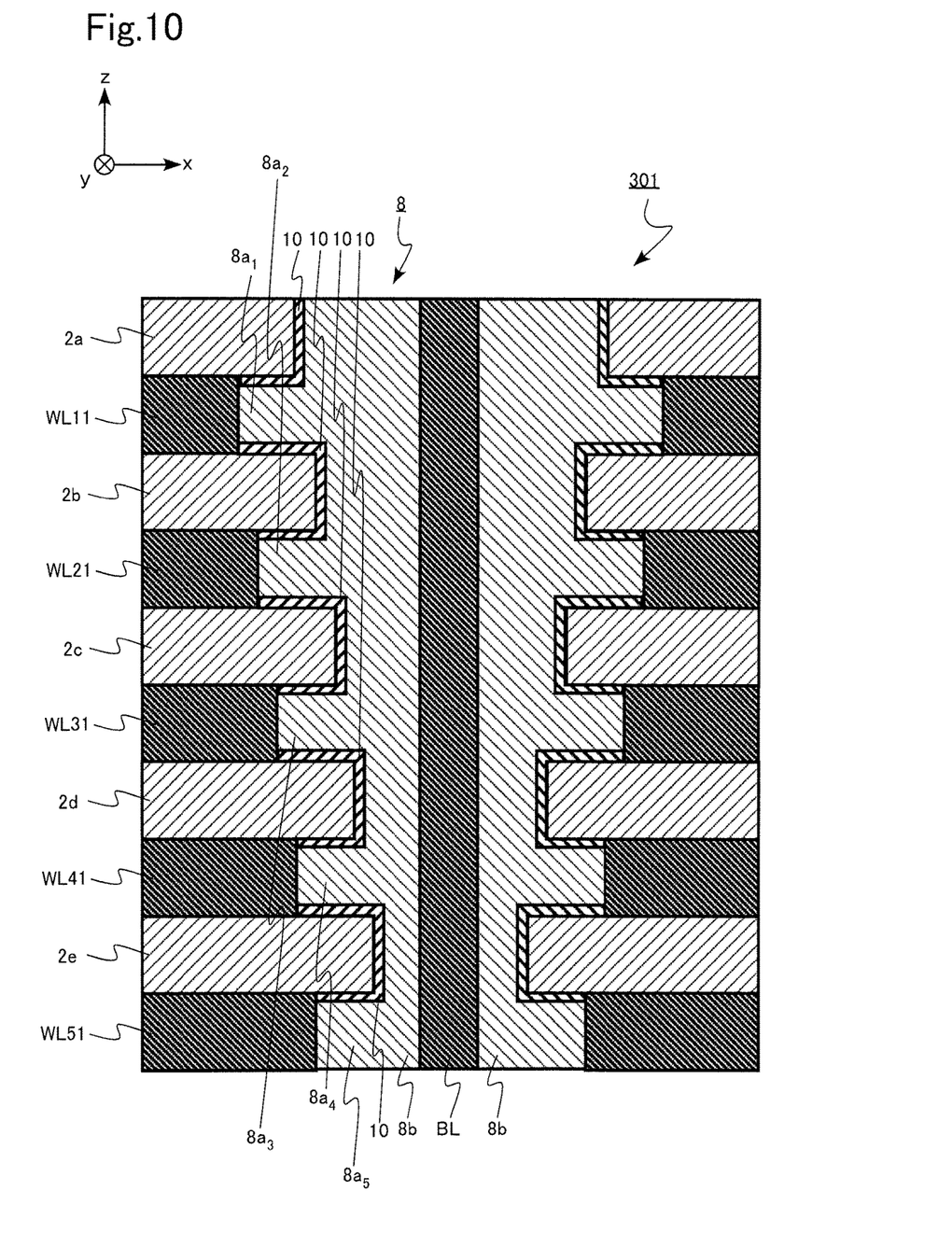
FIG. 10 is a schematic cross-sectional view of main portions of a memory cell array of a storage apparatus according to a third embodiment.
Figure 11A:
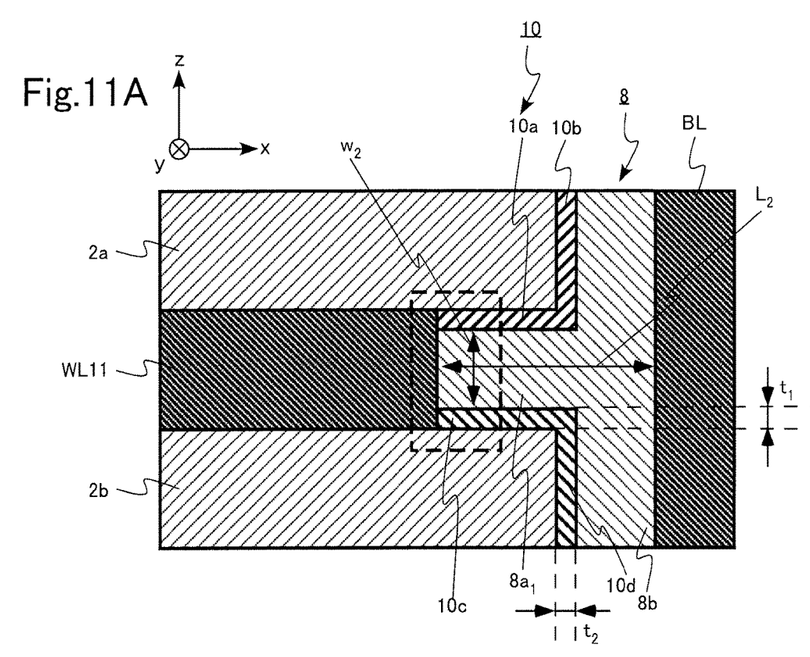
FIGS. 11A and 11B are schematic cross-sectional views of main portions of the memory cell array of the storage apparatus according to the third embodiment.
Figure 11B:
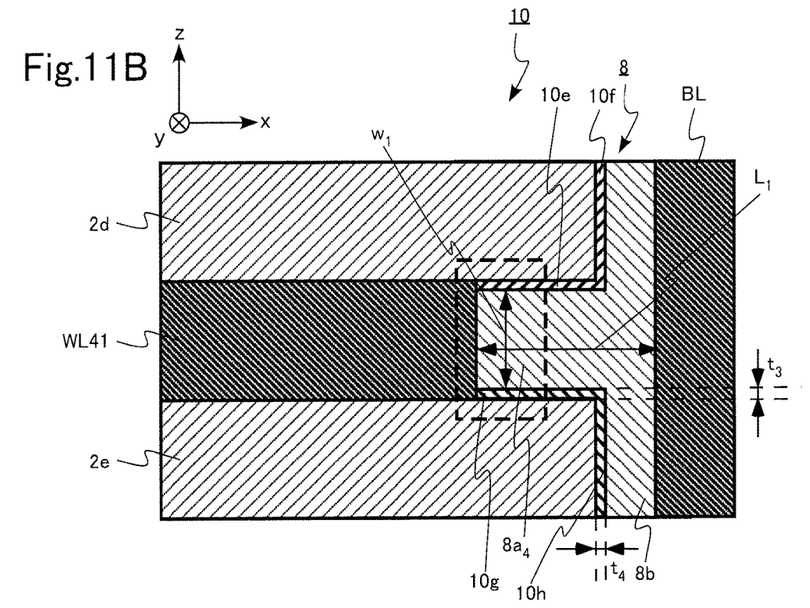

FIG. 10 is a schematic cross-sectional view of a memory cell array 301 of the storage apparatus according to the present embodiment. FIGS. 11A and 11B are schematic cross-sectional views of main portions of the memory cell array 301 of the storage apparatus according to the present embodiment.

The plurality of interlayer insulating films 2 (2a, 2b, 2c, 2d, and 2e) extend in the y-direction.

The word lines WL 11, WL 21, WL 31, WL 41, and WL 51 are provided between the interlayer insulating films, and extend in the y-direction.

While FIG. 10 illustrates a case where each of the number of interlayer insulating films and word lines WL is five, it is not limited to this number.

The bit line BL 11 extends in the z-direction.

The resistance change layer 8 includes the plurality of first portions 8a and the second portion 8b.

The plurality of first portions 8a ($8a_1$, $8a_2$, $8a_3$, $8a_4$, and $8a_5$) is provided between the plurality of interlayer insulating films 2a, 2b, 2c, 2d, and 2e, respectively.

The second portion 8b is provided between the bit line BL 11 and the plurality of first portions 8a and between the bit line BL 11 and the plurality of interlayer insulating films 2 (2a, 2b, 2c, 2d, and 2e).

The plurality of sidewall insulating films 10 (10a, 10b, 10c, 10d, 10e, 10f, 10g, and 10h) is provided between the first portion 8a and the interlayer insulating film 2 and between the second portion 8b and the interlayer insulating film 2.

In FIG. 11A, the sidewall insulating film 10a is provided between the first portion $8a_1$ and the interlayer insulating film 2a. The sidewall insulating film 10b is provided between the second portion 8b and the interlayer insulating film 2a. The sidewall insulating film 10c is provided between the first portion $8a_1$ and the interlayer insulating film 2b. The sidewall insulating film 10d is provided between the second portion 8b and the interlayer insulating film 2b.

In FIG. 11B, the sidewall insulating film 10e is provided between the first portion $8a_4$ and the interlayer insulating film 2d. The sidewall insulating film 10f is provided between the second portion 8b and the interlayer insulating film 2d. The sidewall insulating film log is provided between the first portion $8a_4$ and the interlayer insulating film 2e. The sidewall insulating film 10h is provided between the second portion 8b and the interlayer insulating film 2e.

A first distance $L_1$ between the word line (one first conductive layer) WL 41 and the bit line (second conductive layer) BL is shorter than a second distance $L_2$ between the word line (another first conductive layer) WL 11 and the bit line (second conductive layer) BL.

Furthermore, the thickness of the sidewall insulating film 10 (10e or 10g) provided between the interlayer insulating film 2 (2d or 2e) adjacent to the word line (one first conductive layer) WL 41 and the first portion $8a_4$ adjacent to the word line (one first conductive layer) WL 41 is smaller than the thickness of the sidewall insulating film 10 (10a or 10c) provided between the interlayer insulating film 2 (2a or 2b) adjacent to the word line (another first conductive layer) WL 11 and the first portion $8a_1$ adjacent to the word line (another first conductive layer) WL 11.

Furthermore, a thickness $w_1$ of the first portion $8a_4$ adjacent to the word line (the one first conductive layer) WL 41 is greater than a thickness $w_2$ of the first portion $8a_1$ adjacent to the word line (the other first conductive layer) WL 11.

For example, there is an assumable case of the memory cell array 301 formed by stacking the combination of the interlayer insulating film 2 and the word line WL by a total of n times. In this assumable example, the distance between the word lines provided on the left and right sides of the bit line BL in the first stacked portion is about A nm and the distance between the word lines provided on the left and right sides of the bit line BL in the nth stacked portion is about B nm, for example. In this case, when the thickness of the first portion 8 in the first stacked portion is about C nm, the thickness of the first portion 8 in the nth stacking portion is preferably about AC/B nm in order to equalize the size of the memory cell in the initial stacked portion with the size of the memory cell in the nth stacked portion.

Furthermore, it is preferable that the difference between the thickness of the sidewall insulating film (sidewall insulating film 10e or the sidewall insulating film log in the memory cell according to the present embodiment) provided in the lowermost layer and the thickness of the sidewall insulating film (for example, the sidewall insulating film 10a or the sidewall insulating film 10c in the memory cell of FIGS. 10A and FIGS. 11A and 11B) is 1 nm or more and 5 nm or less.

The thickness of the sidewall insulating film 10e may be substituted by the thickness of the sidewall insulating film 10f. The thickness of the sidewall insulating film 10g may be substituted by the thickness of the sidewall insulating film 10h. The thickness of the sidewall insulating film 10a may be substituted by the thickness of the sidewall insulating film 10b. The thickness of the sidewall insulating film 10c may be substituted by the thickness of the sidewall insulating film 10d.

The thickness of the sidewall insulating film 10, the thickness of the first portion, the distance between the word line WL and the bit line BL, or the like, can be measured by observation with a transmission electron microscope, for example.

Next, operational effect of the present embodiment will be described.

With the increase in the number of stacking of the combination of the word line WL and the interlayer insulating film 2, it would be difficult to provide a hole for forming the bit line BL and the resistance change layer 8 to be perpendicular to the word line WL and the film surface of the interlayer insulating film 2 and this might cause a tapered form in many cases. This would make the size of the memory cell formed in the portion where the small hole is formed to be smaller than the size of the memory cell formed in the portion where the large hole is formed. This would generate variation in the magnitude of the current for reading and writing.

In the storage apparatus according to the present embodiment, the first distance $L_1$ between the word line (one first conductive layer) WL 41 and the bit line (second conductive layer) BL is shorter than the second distance $L_2$ between the word line (the other first conductive layer) WL 11 and the bit line (second conductive layer) BL.

Furthermore, the thickness of the sidewall insulating film 10 (10e or 10g) provided between the interlayer insulating film 2 (2d or 2e) adjacent to the word line (one first conductive layer) WL 41 and the first portion $8a_4$ adjacent to the word line (one first conductive layer) WL 41 is smaller than the thickness of the sidewall insulating film 10 (10a or 10c) provided between the interlayer insulating film 2 (2a or 2b) adjacent to the word line (another first conductive layer) WL 11 and the first portion $8a_1$ adjacent to the word line (another first conductive layer) WL 11.

That is, the thickness of the sidewall insulating film of the memory cell formed in the portion where the small hole is formed is decreased, while the thickness of the sidewall insulating film of the memory cell formed in the portion where the large hole is formed is increased.

This makes it possible to further equalize the size of the memory cell in the memory cell array 301.

Furthermore, the thickness $w_1$ of the first portion $8a_4$ adjacent to the word line (the one first conductive layer) WL 41 according to the present embodiment is greater than the thickness $w_2$ of the first portion $8a_1$ adjacent to the word line (the other first conductive layer) WL 11. This makes it possible to further equalize the size of the memory cell in the memory cell array 301.

In a case where the difference between the thickness of the sidewall insulating film provided in the lowermost layer and the thickness of the sidewall insulating film provided in the uppermost layer of the memory cell is 1 nm or more and 5 nm or less, it is possible to further equalize the size of the memory cells.

With the storage apparatus according to the present embodiment, it is possible to provide a storage apparatus in which the sizes of the memory cells in the memory cell array 301 are further equalized.

Fourth Embodiment

The storage apparatus according to the present embodiment is different from the storage apparatus according to the third embodiment in that the storage apparatus is a ReRAM device. The description overlapping with the first to third embodiments will be omitted.

Figure 12A:
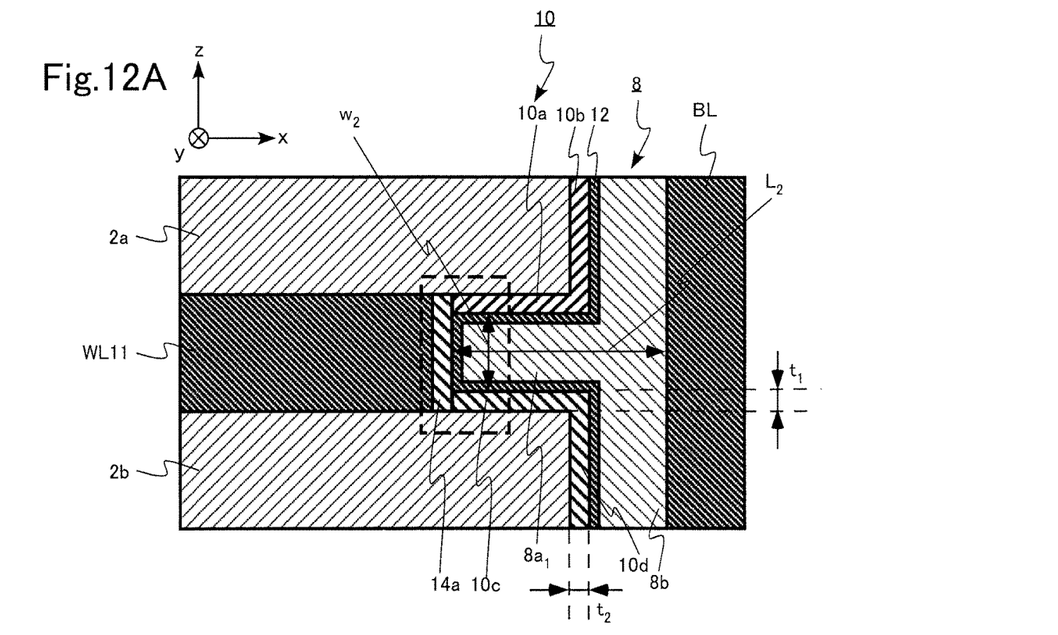
FIGS. 12A and 12B are schematic cross-sectional views of main portions of the memory cell array of a storage apparatus according to a fourth embodiment.
Figure 12B:
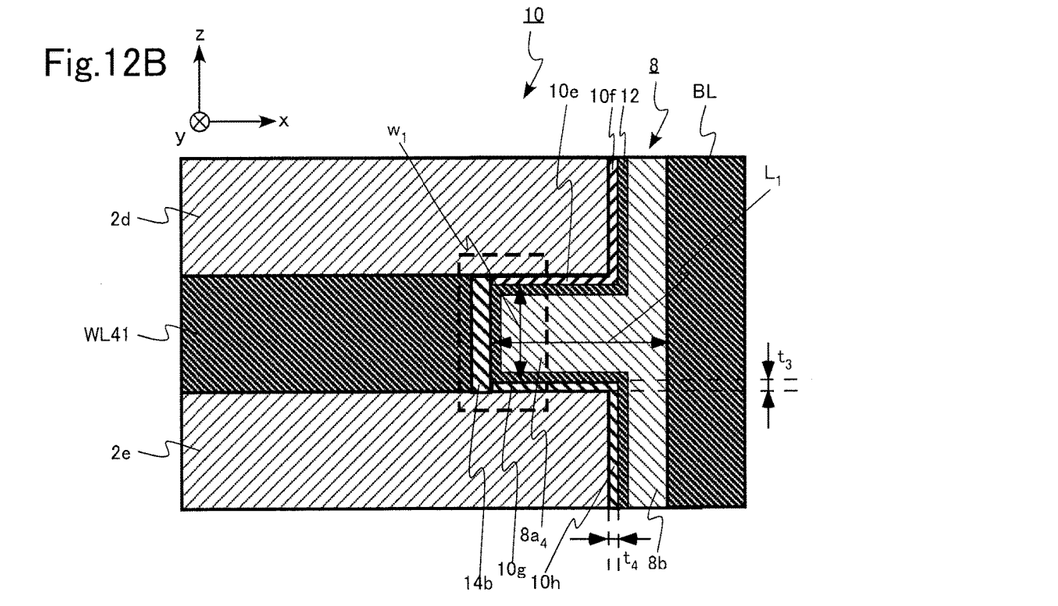

FIGS. 12A and 12B are schematic cross-sectional views of main portions of a memory cell array of the storage apparatus according to the present embodiment.

In the storage apparatus according to the present embodiment, the first distance $L_1$ between a semiconductor region 14b and the bit line (second conductive layer) BL is shorter than the second distance $L_2$ between a semiconductor region 14a and the bit line (second conductive layer) BL.

With the storage apparatus according to the present embodiment, it is possible to provide a storage apparatus in which the sizes of the memory cells in the memory cell array are further equalized.

While certain embodiments have been described, these embodiments have been presented by way of example only, and are not intended to limit the scope of the inventions. Indeed, the storage apparatus described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A storage apparatus comprising:
 a first interlayer insulating film extending in a first direction;
 a second interlayer insulating film extending in the first direction;
 a first conductive layer extending in the first direction and provided between the first interlayer insulating film and the second interlayer insulating film;
 a second conductive layer extending in a second direction intersecting the first direction;
 a resistance change layer including a first portion provided between the first interlayer insulating film and the second interlayer insulating film and including a second portion provided between the second conductive layer and the first interlayer insulating film, between the second conductive layer and the first conductive layer, and between the second conductive layer and the second interlayer insulating film; and
 a sidewall insulating film provided between the first portion and the first interlayer insulating film and between the first portion and the second interlayer insulating film.

2. The apparatus according to claim 1, wherein the resistance change layer contains chalcogenide.

3. The apparatus according to claim 1, wherein the sidewall insulating film is further provided between the second portion and the first interlayer insulating film and between the second portion and the second interlayer insulating film.

4. The apparatus according to claim 1, further comprising:
 an oxide region provided in the first conductive layer and the first portion; and
 a semiconductor region provided between the first conductive layer and the oxide region.

5. The apparatus according to claim 4, wherein the resistance change layer contains titanium oxide, tungsten oxide, or niobium oxide, and the semiconductor region contains silicon or germanium.

6. The apparatus according to claim 5, wherein the oxide region contains aluminum oxide, hafnium oxide, or zirconium oxide.

* * * * *